United States Patent
Guo et al.

(10) Patent No.: US 9,343,183 B2
(45) Date of Patent: May 17, 2016

(54) MEMORY DEVICE RETENTION MODE BASED ON ERROR INFORMATION

(71) Applicants: Ziyu Guo, Tianjin (CN); Xiangming Kong, Tianjin (CN); Shayan Zhang, Austin, TX (US)

(72) Inventors: Ziyu Guo, Tianjin (CN); Xiangming Kong, Tianjin (CN); Shayan Zhang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 86 days.

(21) Appl. No.: 14/463,674

(22) Filed: Aug. 20, 2014

(65) Prior Publication Data

US 2015/0106671 A1   Apr. 16, 2015

(30) Foreign Application Priority Data

Oct. 15, 2013   (CN) .......................... 2013 1 0480380

(51) Int. Cl.
| | |
|---|---|
| *G11C 29/50* | (2006.01) |
| *G11C 29/52* | (2006.01) |
| *G06F 1/32* | (2006.01) |
| *G11C 5/14* | (2006.01) |
| *G11C 11/417* | (2006.01) |
| *G11C 29/04* | (2006.01) |

(52) U.S. Cl.
CPC ........ *G11C 29/50016* (2013.01); *G06F 1/3275* (2013.01); *G06F 1/3296* (2013.01); *G11C 5/147* (2013.01); *G11C 11/417* (2013.01); *G11C 29/50004* (2013.01); *G11C 29/52* (2013.01); *G11C 2029/0409* (2013.01)

(58) Field of Classification Search
CPC ........................................................ G11C 29/50
USPC .......................................... 714/721, 718, 746
See application file for complete search history.

(56) References Cited

U.S. PATENT DOCUMENTS

| | | | | |
|---|---|---|---|---|
| 7,183,825 | B2 * | 2/2007 | Padhye | G11C 5/147 327/202 |
| 7,365,596 | B2 * | 4/2008 | Padhye | G06F 13/4072 327/200 |
| 7,400,545 | B2 | 7/2008 | Ramaraju et al. | |
| 7,793,173 | B2 | 9/2010 | Chang et al. | |
| 8,310,894 | B1 | 11/2012 | Su et al. | |
| 8,365,030 | B1 * | 1/2013 | Choi | G06F 11/1048 714/746 |
| 8,514,611 | B2 | 8/2013 | Nguyen et al. | |
| 2008/0307240 | A1 * | 12/2008 | Dahan | G06F 1/06 713/320 |
| 2013/0159797 | A1 * | 6/2013 | Peng | G11C 16/349 714/718 |

* cited by examiner

*Primary Examiner* — Fritz Alphonse
(74) *Attorney, Agent, or Firm* — Charles E. Bergere

(57) ABSTRACT

A controller for a memory device has a power control section to control power to a memory element in an operation mode and in a retention mode. A monitoring section receives and monitors error information and a storage section stores a retention parameter. In the operation mode, the power control section causes an operation voltage to be applied to the memory element, and in the retention mode, the power control section causes a time-varying voltage to be applied to the memory. The power control section also causes the voltage across the memory element to change in the retention mode between a first retention voltage and a second retention voltage based on the retention parameter.

20 Claims, 6 Drawing Sheets

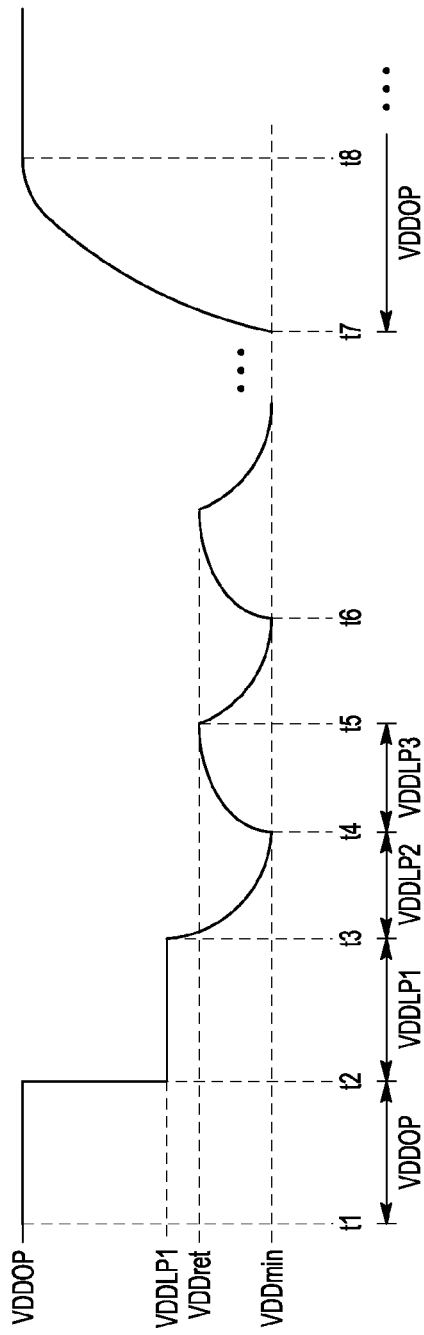
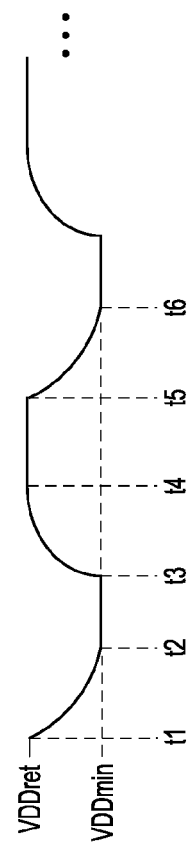
FIG. 3
FIG. 4

MEMORY DEVICE RETENTION MODE BASED ON ERROR INFORMATION

BACKGROUND OF THE INVENTION

The present invention relates generally to memory devices, and, more particularly, to a controller for a memory device with a low-power retention mode.

In order to reduce power consumption, certain devices may be placed in a low-power mode when not active. In the low power mode some components may be supplied with a voltage that is lower than the normal operating voltage. Reducing the voltage across components can reduce leakage currents, leading to a reduction in power consumption by the device.

For some circuits, such as Static Random-Access Memory (SRAM) devices, it may be necessary to preserve logic values while the component is in a power-saving mode. SRAM is considered to be a form of volatile memory, as data will eventually be lost after power is removed. However, data stored in SRAM will typically persist for a short time after power is removed.

The present invention provides a memory controller and a method for retaining data yet saving power.

BRIEF DESCRIPTION OF THE DRAWINGS

The invention, together with objects and advantages thereof, may best be understood by reference to the following description of preferred embodiments together with the accompanying drawings in which:

FIG. 3 is a timing diagram showing a voltage across a memory element in accordance with an embodiment of the present invention;

FIG. 4 is a timing diagram showing a voltage across a memory element in accordance with an embodiment of the present invention;

DETAILED DESCRIPTION OF PREFERRED EMBODIMENTS

Figure 1:
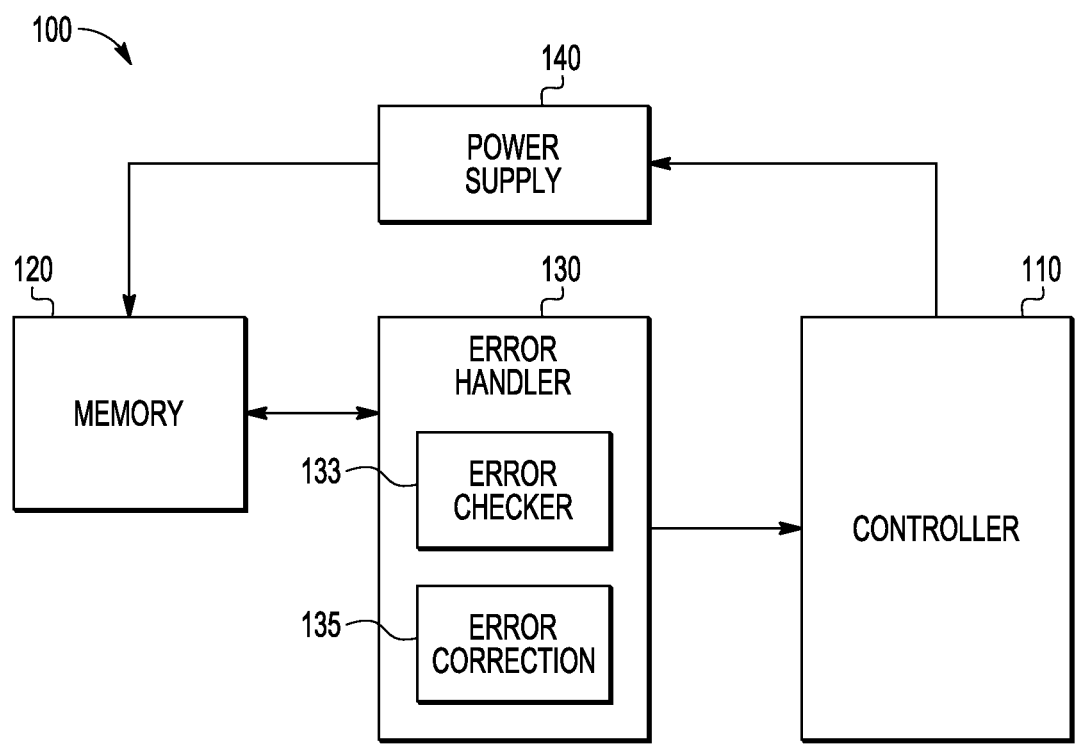
FIG. 1 is a schematic block diagram of an electronic device having a low-power mode.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a controller for a memory device. The controller includes a power control section to control power to a memory element of the memory device in an operation mode and in a retention mode. A monitoring section receives and monitors error information indicative of an error in the memory device. A storage section stores a retention parameter. The retention parameter is set based on the error information. The power control section causes an operation voltage to be applied to the memory element in the operation mode, and a time-varying voltage to be applied to the memory element in the retention mode. The power control section causes the voltage across the memory element to change in the retention mode between a first retention voltage and a second retention voltage, wherein the second retention voltage is less than the first retention voltage, and the first retention voltage is less than the operation voltage. The power control section controls the second retention voltage based on the retention parameter.

In another embodiment, the present invention provides an electronic device including a memory and a memory controller. The memory controller includes a power control section to control power to a memory element of the memory device in an operation mode and in a retention mode. A monitoring section receives and monitors error information indicative of an error in the memory device. A storage section stores a retention parameter. The power control section causes an operation voltage to be applied to the memory element in the operation mode, and a time-varying voltage to be applied to the memory element in the retention mode. The power control section causes the voltage across the memory element to change in the retention mode between a first retention voltage and a second retention voltage, where the second retention voltage is less than the first retention voltage, and the first retention voltage is less than the operation voltage. The power control section controls the second retention voltage based on the retention parameter, where the retention parameter is set based on the error information.

In another embodiment, the present invention provides a method of controlling power to a memory device. The method includes providing an operation voltage to the memory device in an operation mode, and providing a time-varying voltage to the memory device in a retention mode. The method also includes changing the voltage across memory elements of the memory device, based on a retention parameter, between a first retention voltage (VDDret) and a second retention voltage (VDDmin), where the second retention voltage (VDDmin) is less than the first retention voltage (VDDret), and the first retention voltage (VDDret) is less than the operation voltage (VDDOP); receiving error information indicative of an error in the memory device; and setting the retention parameter based on the error information.

Referring now to FIG. 1, an electronic device 100 in accordance with an embodiment of the present invention is shown. The device 100 includes a controller 110, a memory device 120, and an error handler 130. The controller 110 controls a power supply 140 that provides power to the memory device 120.

The memory device 120 is in communication with the error handler 130. The error handler 130 includes an error check section 133 and an error correction section 135. Stored data is read from the memory device 120 and provided to the error handler 130. Address information relating to the memory location of the data also may be passed between the memory device 120 and the error handler 130. In one embodiment, the error handler 130 uses an error-correcting code (ECC) to validate the integrity of the data. The data stored in the memory device 120 may incorporate an error-correction code. When the data is read, the error check section 133 determines, based on the error-correction code, whether or not an error has occurred in the data. When an error is detected by the error check section 133, information relating to the error is provided to the controller 110. Associated address information may also be passed to the controller 110. In one embodiment, the error check section 133 also passes the data to the error correction section 135.

The error correction section 135 attempts to correct the detected error. In some examples, a determination is made whether or not the detected error can be corrected. In some examples, the error check section 133 determines whether or not a detected error can be corrected, and passes the data to the error correction section 135 only if it is determined that the error can be corrected. In some examples the error correction section 135 determines whether or not a detected error can be corrected, and attempts to correct the error only if it determined that the error can be corrected. When it is determined that an error cannot be corrected, other remedial action may be performed, such as restarting the device 100.

In some examples, the error check section 133 is capable of detecting single or double bit errors and the error correction section 135 is capable of correcting single bit errors.

In some examples, the error handler 130 may include an error address detector to determine a memory address of a detected error. Furthermore, the error handler 130 may include an error failure rate detector to determine a rate or frequency with which errors recur at the same address.

The controller 110 controls power to the memory device 120 in an operation mode and in a retention mode. The operation mode is the normal operating mode of the memory device 120, in which the memory may be read to and written from, for example. The retention mode is a low-power mode, in which the memory does not operate (e.g., is not readable or writeable), but retains the data stored in the memory device 120. The retention mode may be associated with a sleep mode, and may be entered, for example, after a predetermined period of inactivity. In the retention mode, the controller 110 causes the retention voltage across the memory elements of the memory device 120 to change between a first retention voltage and a second retention voltage, where the second retention voltage is less than the first retention voltage, and the first retention voltage is less than the operation voltage. The voltage applied to the memory device 120 in the low-power mode is controlled based on a retention parameter, stored by the controller 110. The retention parameter controls a balance between power reduction in the retention mode and the risk of introducing data errors in the retention mode. In some examples, the ECC single bit failure rate is used as a measure of the robustness of memory retention.

The retention parameter is set, or reset, by the controller 110 based on the information relating to detected errors provided to the controller 110 from the error check section 133 of the error handler 130.

Figure 2:
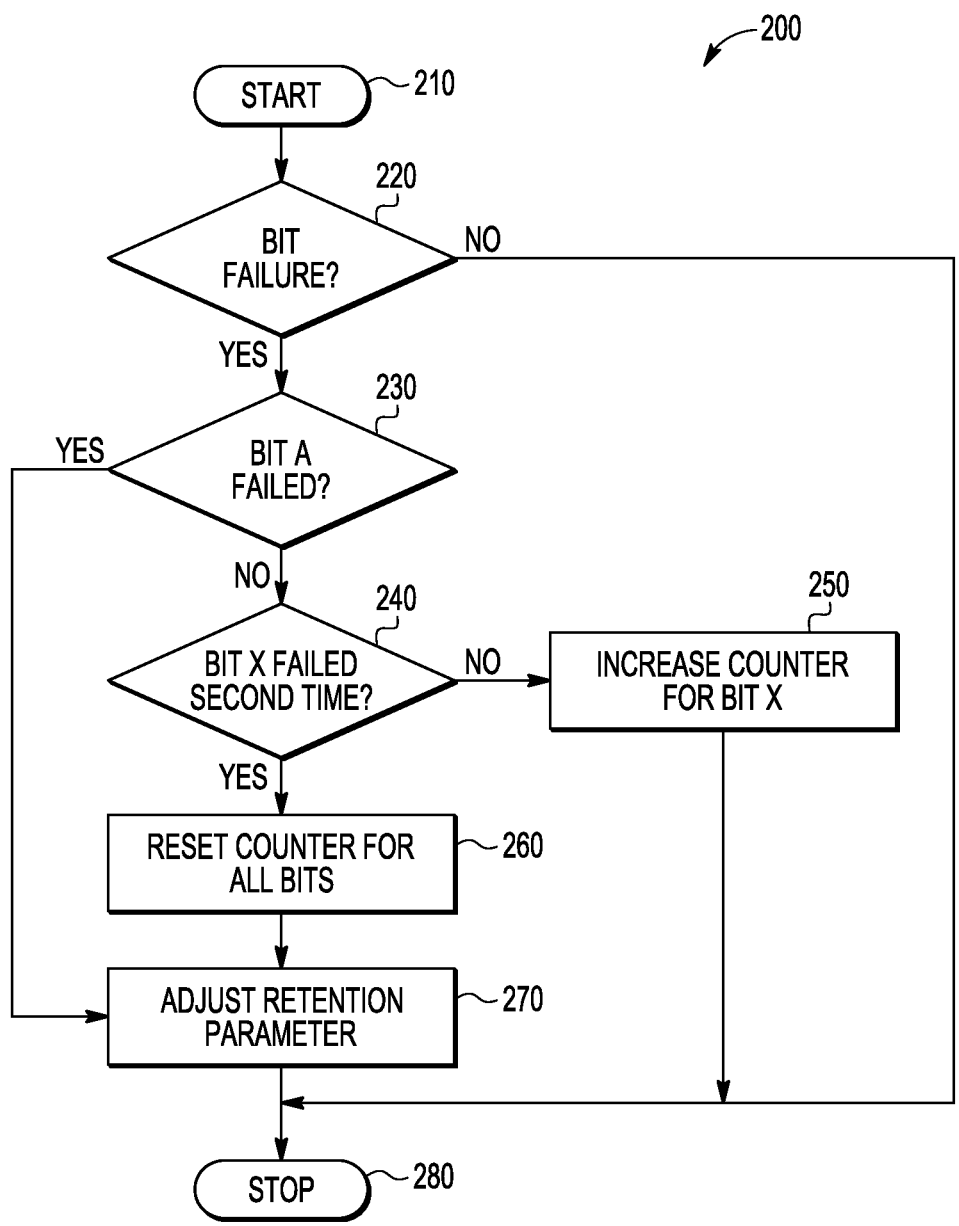
FIG. 2 is a flow chart illustrating a method for adjusting a retention parameter in accordance with an embodiment of the present invention.

FIG. 2 shows a flow chart of an example of a method 200 for determining whether or not the retention parameter is to be set (e.g., reset or adjusted)

The method begins at 210. At 220, it is determined whether a data error, such as a bit failure has been detected. In some examples the whole memory device 120 is checked for errors once after entering the operation mode from the retention mode. If no error has been detected, it is determined that the retention parameters are appropriate, and the method terminates at 280. When an error is detected at 220, the method moves to 230, where it is determined whether Bit A has failed. Bit A refers to a memory element of the memory device 120 that has previously been detected as a weak bit or a bit that is susceptible to errors due to a low supply voltage. Bit A may be determined by a built-in self-test (BIST), for example. If it is determined that Bit A has failed, the method advances to 260. If Bit A has not failed, the method proceeds to 240. At 240, the failed bit (which is not Bit A) is indicated as Bit X. If this is the first time that this particular bit has failed, the method moves to 250, where a counter associated with this bit is incremented. Alternatively the failure of this particular bit may be tracked in some other way. The process then terminates at 280. The incremented counter for Bit X is retained during subsequent cycles between the retention mode and operation mode (e.g., until reset at step 260 in a subsequent operation mode). Thus, a further failure of the same Bit X, before the counter has been reset, results in the method following the "Yes" branch at step 240. If at step 240 it is determined (e.g., based on the counter for that particular bit) that Bit X has failed previously (i.e., that the current failure is the second failure of Bit X), the method moves to step 260. At step 260, the counters of bits that have previously failed are reset, or the tracking of the failed bits is updated in some other way, to reflect that the retention parameter has been adjusted. At step 270, the retention parameter is adjusted in order to reduce the occurrence of data errors in a subsequent retention mode. The method then ends at 280. In some examples, the retention parameter is adjusted at most once between consecutive periods of retention mode. This avoids further adjustment of the retention parameter based on errors that occurred with the parameter at its previous value.

In the embodiment shown in FIG. 2, one error in Bit X does not lead to an adjustment of the retention parameter, but two errors in the same bit does, possibly within a bounded period of time. For example, the retention parameter may be adjusted if Bit X fails twice in successive retention modes, such that a second failure of Bit X would not cause the retention parameter to be adjusted if a retention mode occurred between the failures and Bit X did not fail in that retention mode. This helps to distinguish errors that are likely to have been caused by insufficient voltage in a retention mode (e.g., due to poorly set or sub-optimal retention parameters) that are expected to occur at the same bit repeatedly from other errors (e.g., soft errors caused by radiation, for example) that are expected to occur at random bits.

Other algorithms are possible, for example based only on a failure in Bit A, or based only on a failure of Bit X. The number of failures of Bit A and Bit X required to cause a change in the retention parameter are 1 and 2, respectively, in the above example, but other values could be chosen. For example, more than one error in Bit A may be required before adjusting the retention parameter. Similarly, a single error in Bit X, or more than two errors in Bit X may be required before adjusting the retention parameter. In some examples, only the most recent Bit X failure is recorded, such that two consecutive failures of the same bit are required to cause a change in a retention parameter. Other criteria could also be used. For example, failure of more than a predetermined threshold number of different bits could be required. A combination of criteria could be used. The tracking of bits for which a data error has been detected (e.g., the counter for Bit X) may be reset in a number of ways and at various times. For example, the tracking may be reset if no further error is detected after a predetermined number of transitions to the data retention mode and back to the operation mode.

FIG. 3 shows a graph illustrating an example of voltage supplied to the memory device 120 by the power supply 140 under the control of the controller 110.

At time t1 the memory device is in the operation mode, and is supplied with voltage $V_{DDOP}$. At time t2, the memory device transitions to a first low power mode, and remains in the first low power mode between t2 and t3. In the first low power mode the memory device 120 receives power at a voltage $V_{DDLP1}$ that is less than the operating voltage, $V_{DDOP}$. In the first low power mode, the voltage across elements of the memory device 120 is reduced relative to the voltage in the operation mode, reducing leakage current. $V_{DDLP1}$ may be set at a level that is sufficient to reliably retain data in the memory device. In some examples $V_{DDLP1}$ is set to a minimum data retention voltage specified by the manufacturing foundry, $V_{DDM}$. In some examples $V_{DDM}$ may be 0.57V, for example. Typically $V_{DDM}$ is set conservatively, and is larger than a measured minimum retention voltage, $V_{min}$, in order to cover extrinsic outliers caused by variations over a large sample of memory elements (e.g. >8 MB of SRAM bits). For example, $V_{min}$ may be 0.5V, for example. The time period $T_{WAIT}$ between t2 and t3 may be a predetermined time period that is counted, for example using a clock signal.

The transition from $V_{DDOP}$ to $V_{DDLP1}$ is illustrated as essentially immediate, but in practice the transition may be gradual, and may be determined by an impedance of the memory device, the output performance of power control system and/or a users' selection.

At time t3 the memory device transitions to a second low power mode, in which a variable voltage is applied to the memory device. Between t3 and t4 a voltage $V_{DDLP2}$ is applied to the memory elements of the memory device. $V_{DDLP2}$ is less than $V_{DDLP1}$. Between t3 and t4, the voltage across the memory elements falls from $V_{DDLP1}$ to $V_{DDmin}$. At time t4 the voltage across the memory elements reaches $V_{DDmin}$ and a voltage $V_{DDLP3}$ is applied across the memory elements. $V_{DDLP3}$ is greater than $V_{DDLP2}$ and $V_{DDmin}$, causing the voltage across the memory elements to increase. At time t5, the voltage across the memory elements reaches $V_{DDret}$ and the voltage applied to the memory element is again reduced to $V_{DDLP2}$. The pattern of alternating applied voltage between $V_{DDLP2}$ and $V_{DDLP3}$ is repeated until t7. At t7 the memory device is to be placed in operation mode, and $V_{DDOP}$ is applied to the memory elements. The voltage across the memory elements increases, and at t8 the voltage across the memory elements is $V_{DDOP}$.

As can be seen, $V_{DDmin} \geq V_{DDLP2}$, and $V_{DDret} \leq V_{DDLP3}$. In some examples $V_{DDLP2}$ may be the ground voltage. In other examples $V_{DDLP2}$ may equal $V_{DDmin}$. In some examples $V_{DDret}$ may be equal to $V_{DDLP3}$. In some examples $V_{DDLP3} < V_{DDLP1}$, and in some examples $V_{DDLP3} = V_{DDLP1}$. It is also possible for $V_{DDLP3} > V_{DDLP1}$.

$V_{DDret}$ may be considered to be a first retention voltage, and $V_{DDmin}$ may be considered to be a second retention voltage.

When $V_{DDLP2} = V_{DDmin}$ the voltage across the memory element may be maintained at $V_{DDmin}$ for a non-zero period of time (e.g., a predetermined period of time). Similarly, when $V_{DDret} = V_{DDLP3}$, the memory element may be maintained at $V_{DDret}$ for a non-zero period of time (e.g. a predetermined period of time).

FIG. 4 shows an example of a voltage across a memory element where the voltage across the memory element is maintained at each of $V_{DDret}$ and $V_{DDmin}$ for non-zero periods of time. In some examples the voltage across the memory element is maintained at only one, or neither, of $V_{DDret}$ and $V_{DDmin}$ for non-zero periods of time. In FIG. 4, at t1, the voltage across the memory element drops from $V_{DDret}$, and at time t2 reaches $V_{DDmin}$. The voltage remains at $V_{DDmin}$ until t3, when a higher voltage $V_{DDLP3} = V_{DDret}$) is applied to the memory elements. At t4 the voltage reaches $V_{DDret}$ and remains at this voltage until t5, when the applied voltage is reduced (to $V_{DDLP2} = V_{DDmin}$). At t6 the voltage across the memory element reaches $V_{DDmin}$, and the process continues until the retention mode is terminated.

In FIGS. 3 and 4, the transition between different voltage levels is schematic only. Typically the rate and form of the transition will depend, inter alia, on the impedance of the storage section and associated power conductor grid and the capacitance of the power supply, and other forms (e.g., essentially linear transitions) are possible.

The second low power mode has a lower RMS voltage than the first low power mode, and so the leakage current is lower in the second low power mode. The intermittent application of the $V_{DDLP3}$ refreshes, or restores, the charge in the memory elements, to avoid or reduce the occurrence of data errors due to the application of a voltage below $V_{DDLP1}$.

The first low-power mode (e.g., the period between t2 and t3 of FIG. 3) could be considered to be a part of the data retention mode. However, for the purposes of the current description, data retention mode describes the second low-power mode (e.g., the period between t3 and t7 in FIG. 3). Periods of voltage transition between modes, e.g. between t7 and t8 of FIG. 3 can be assigned to either, or neither, of the neighbouring modes. For example, the period between t7 and t8 may be considered to be part of the second low-power mode (data retention mode), could be considered to be part of the operation mode, or could be considered to be a separate transitional mode. In some examples, the memory device is considered to be in operation mode only when the voltage across the memory elements has reached the operating voltage level $V_{DDOP}$. This can help to avoid operating the memory device when the voltage is below the nominal operating voltage, improving reliability.

In some examples, the memory device transitions directly from the operation mode to the second low-power mode, without going via the first low-power mode.

In some examples, the memory device transitions directly from the first low-power mode to the operation mode, without going via the second low-power mode, in response to a determination that the second low-power mode is not to be used. For example, the determination may be based on a selection by a user, e.g. controlled by value in a control register set by the user.

Figure 5:
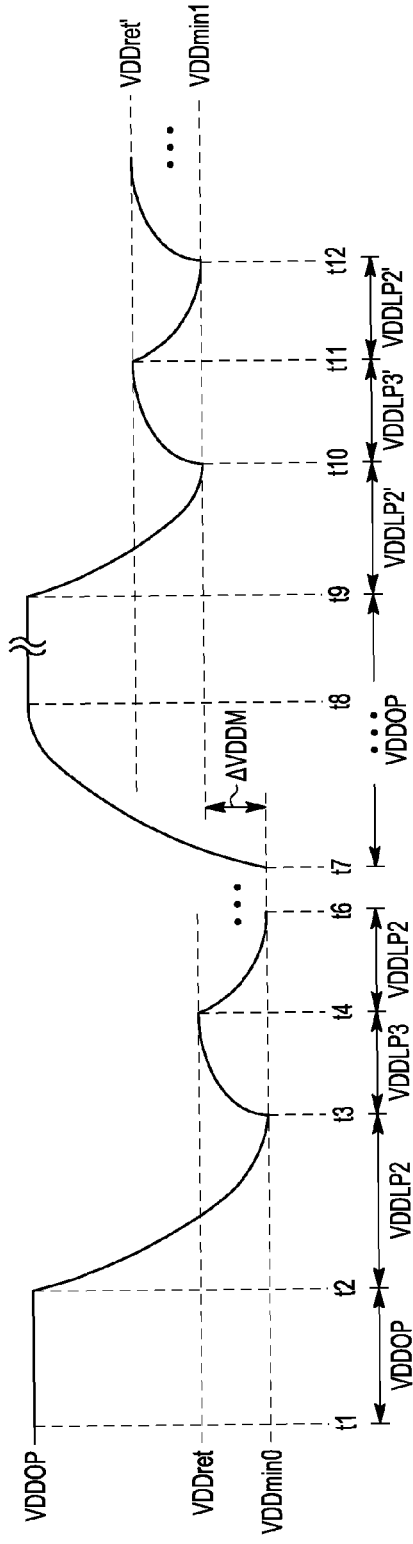
FIG. 5 is a timing diagram of a voltage across a memory element according to an embodiment of the present invention showing $V_{DDmin}$ adjusted.

FIG. 5 shows an example of a voltage across the memory elements when a retention parameter is changed. In the example of FIG. 5, the retention parameter is $V_{DDmin}$. In the period between t1 and t2 the memory device is in the operation mode, as in the example of FIG. 3. In the example of FIG. 5, there is no first low-power mode, and at t2 the memory device transitions directly from the operation mode to the second low-power mode. In this example, $V_{DDmin}$ is a parameter having initial value $V_{DDmin0}$. In some examples $V_{DDmin0}$ is set such that $V_{DDM} > V_{DDmin0} \geq V_{min}$. The second low-power mode is similar to that of FIG. 3. The applied voltage is switched between $V_{DDLP2}$ and $V_{DDLP3}$, and so the voltage across the memory elements varies between $V_{DDmin0}$ and $V_{DDret}$, as in FIG. 3. At t7 the memory device is to return to the operation mode, and the applied voltage is increased to $V_{DDOP}$. Between t8 and t9 the memory device is in the operation mode, and read/write operations are performed as normal. For the purposes of this example, we assume that, during the period between t8 and t9 one or more data errors are detected and it is determined that the retention parameter should be changed to improve reliability of the retention mode. According to this example, the parameter $V_{DDmin}$ is adjusted according to $V_{DDmin1}=V_{DDmin0}+\Delta V_{DDM}$, where $\Delta V_{DDM}$ is a predetermined parameter describing a change in the minimum voltage. In some examples $\Delta V_{DDM}$ may have a fixed value (e.g. 0.01V) or may be determined according to an algorithm, such as $\Delta V_{DDM}=(V_{DDLP3}-V_{DDmin})/k$, where $V_{DDmin}$ is the current value of $V_{DDmin}$ (e.g. the most recent of $V_{DDmin0}$, $V_{DDmin1}$, etc.) and k is a fixed integer, e.g. 2, 5 or 10. Other possibilities exist for setting $\Delta V_{DDM}$.

At t9 the memory device is to transition to the second low-power mode, and $V_{DDLP2}'$ is supplied to the memory device. In some examples $V_{DDLP2}'=V_{DDmin1}$. In some examples $V_{DDLP2}'=V_{DDLP2}$ and the supply voltage may be controlled by detecting the voltage across the memory elements to determine when the voltage across the memory elements has reached $V_{DDmin1}$. Between t10 and t11 $V_{DDLP3}'$ is supplied to the memory device. In some examples $V_{DDLP3}'=V_{DDLP3}$. In some examples $V_{DDLP3}'>V_{DDLP3}$, for example $V_{DDLP3}'=V_{DDLP3}+\Delta V_{DDM}$. Where $V_{DDLP3}'=V_{DDLP3}$ it is not necessary to generate additional voltage levels, simplifying the power supply requirements.

At t11 the voltage across the memory elements reaches $V_{DDret}'$. In some examples the voltage supplied to the memory device is controlled such that $V_{DDret}'=V_{DDret}$. In other examples. The voltage supply may be controlled such that $V_{DDret}'>V_{DDret}$. For example, $V_{DDret}'=V_{DDret}+\Delta V_{DDM}$. In some examples, the value of $V_{DDret}'$ is not controlled directly, and is a result of the values of $V_{DDmin1}$, $V_{DDLP3}'$, the period of time between t10 and t11 and the impedance properties of the memory device, etc.

In subsequent cycles of operation, e.g. following a return to the operation mode and further detected errors, the parameter $V_{DDmin}$ may be further adjusted, such that $V_{DDmink+1}=V_{DDmink}+\Delta V_{DDM}$. Where $\Delta V_{DDM}$ can vary between adjustments of $V_{DDmin}$, this can be expressed as $V_{DDmin\ k+1}=V_{DDmin\ k}+\Delta V_{DDM\ k+1}$.

Figure 6:
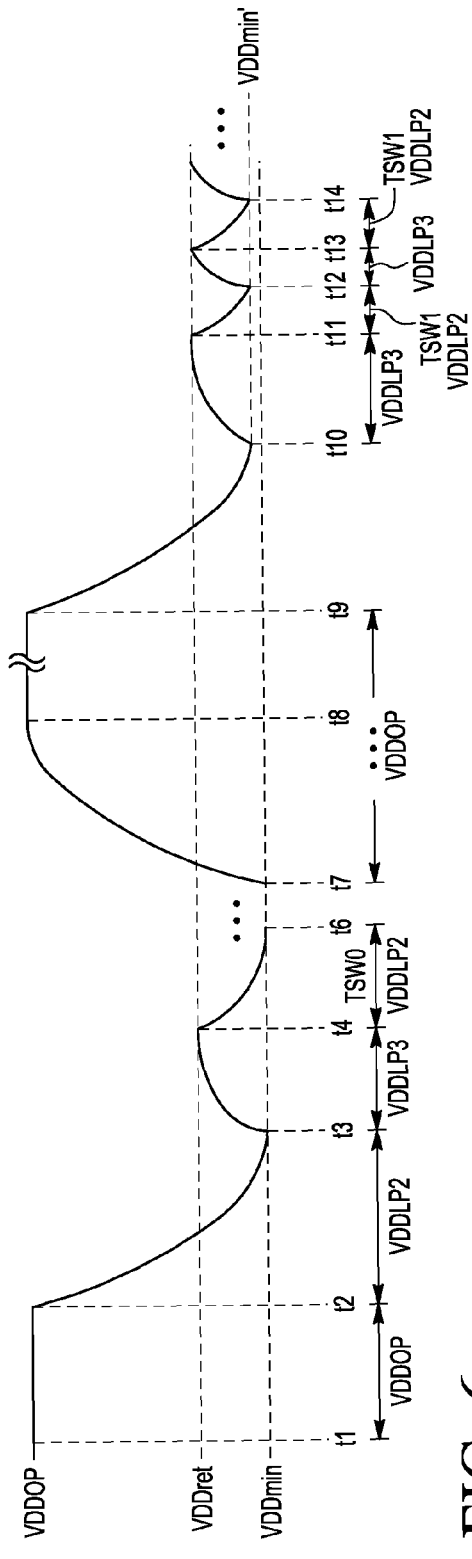
FIG. 6 is a timing diagram of a voltage across a memory element according to an embodiment of the present invention showing $T_{SW}$ adjusted.

FIG. 6 shows an example in which the retention parameter is the power supply switching period $T_{SW}$, that is the time period during which $V_{DDLP2}$ is supplied to the memory device. Between t1 and t6, FIG. 6 is similar to FIG. 5. The period of time between t5 and t6 corresponds to the initial value of $T_{SW}$, $T_{SW0}$. According to some examples, the $V_{DDmin}$ is controlled indirectly by setting $T_{SW}$, such that $V_{DDmin}$ depends on, inter alia, $T_{SW}$, $V_{DDLP2}$, $V_{DDret}$ and the impedance of the memory device. In some examples, the voltage across the memory elements may reach $V_{DDLP2}$ before t6. In this case, $V_{DDmin}=V_{DDLP2}$, and $T_{SW}$ controls the period of time that the voltage across the memory element remains at $V_{DDmin}$.

As in FIG. 5, the memory device returns to the operation mode between t8 and t9, and the retention parameter, $T_{SW}$ in this case, is adjusted due to one or more detected data errors (as described in relation to FIG. 2, for example). In his case, $T_{SW}$ is changed from $T_{SW0}$ to $T_{SW1}$, where $T_{SW1}<T_{SW0}$. As a result, when the memory device returns to the retention mode, the period of time that $V_{DDLP2}$ is applied is reduced, as shown between t11 and t12. Accordingly, the period of time between applications of the retention voltage $V_{DDLP3}$ is reduced, reducing the likelihood of a data error. In some examples, where the voltage across the memory elements has not reached $V_{DDLP2}$ by t12, the minimum voltage across the memory element is increased, e.g., from $V_{DDmin}$ to $V_{DDmin}'$, as shown in FIG. 6. This also reduces the likelihood of data errors. In some examples, when $V_{DDmin}'>V_{DDmin}$ the time required for the voltage to increase from $V_{DDmin}'$ to $V_{DDret}$ may be reduced (e.g., compare t3 to t5 with t12 to t13 in FIG. 6). In some cases, as shown in FIG. 6, the period for applying $V_{DDLP3}$ may be reduced accordingly (e.g., by applying $V_{DDLP3}$ for a period determined based on measurement of the voltage across the memory elements). In other cases, the period of time that $V_{DDLP3}$ is applied is not changed when $T_{SW}$ is changed. Accordingly, the voltage $V_{DDret}$ may increase (to a maximum of $V_{DDLP3}$) as $T_{SW}$ is decreased. Where the voltage reaches $V_{DDLP3}$ before the end of the period that $V_{DDLP3}$ is applied (e.g., before t13 in FIG. 6), a decrease in $T_{SW}$ will result in the voltage across the memory elements reaching $V_{DDLP3}$ earlier and so being maintained at $V_{DDLP3}$ for longer.

Various options are possible for setting $T_{SW1}$. For example, $T_{SW1}=T_{SW0}/2$, or more generally $T_{SWk+1}=T_{SWk}/q$, where q is a predetermined positive real or integer value greater than 1.

For purposes of illustration, FIG. 6 shows the voltage across the memory elements falling to $V_{DDmin}$ between t2 and t3 and $V_{DDmin}'$ between t9 and t10. However, in some examples the time periods t2 to t3 and t9 and t10 equal $T_{SW}$, (i.e. $T_{SW0}$ and $T_{SW1}$, respectively). In this case, the voltage across the memory elements will not necessarily reach $V_{DDmin}$ or $V_{DDmin}'$ at times t3 and t10, respectively. In this case, the details of the voltage across the memory elements $V_{DDmin}'>V_{DDmin}$ would depend on the values of applied voltages, the time periods that the voltages are applied, the impedance of the memory device, etc.

In an alternative example, when $T_{SW}$ is reduced, the loading of the power circuit is adjusted to increase the rate of voltage drop when the applied voltage is changed from $V_{DDLP2}$ to $V_{DDLP3}$ (e.g., between t11 and t12 of FIG. 6) such that $V_{DDmin}'=V_{DDmin}$. Similarly, when $T_{SW}$ is increased, the loading of the power circuit is adjusted to decrease the rate of voltage drop, to maintain $V_{DDmin}$ essentially the same each time the device enters the second low power mode.

According to some examples, adjusting the retention parameter allows the memory device to tune the retention mode to reduce the likelihood of data errors while reducing the power in the retention mode. In some examples the device can be considered to "learn" the optimal (or close to optimal) retention parameter. The tuning or learning automatically takes into account the properties of the specific device resulting from process variations, etc. Furthermore, according to some examples, the tuning or learning allows the retention mode to change with changes in the memory, e.g., in the event that one previously reliable bit (Bit X) becomes more susceptible to failure in the retention mode. Such a change in Bit X could be the result of ageing or exposure to high temperature, for example.

In some examples only one retention parameter is changed. In some examples more than one retention parameter may be changed. For example, when a data error is detected two (or more) retention parameters may be changed simultaneously. In some examples more than one retention parameter is changeable, but only one is changed at a time (such that the device enters the retention mode between each change of a parameter). In such examples the retention parameter that is changed may depend on the type of error (e.g., Bit A or Bit X), may alternate, or may depend on respective values of the retention parameters.

According to some examples, when a retention parameter is to be changed, $T_{SW}$ is halved. When a subsequent parameter change is required, $V_{DDmin}$ is increased and $T_{SW}$ is set to its original value.

Figure 7:
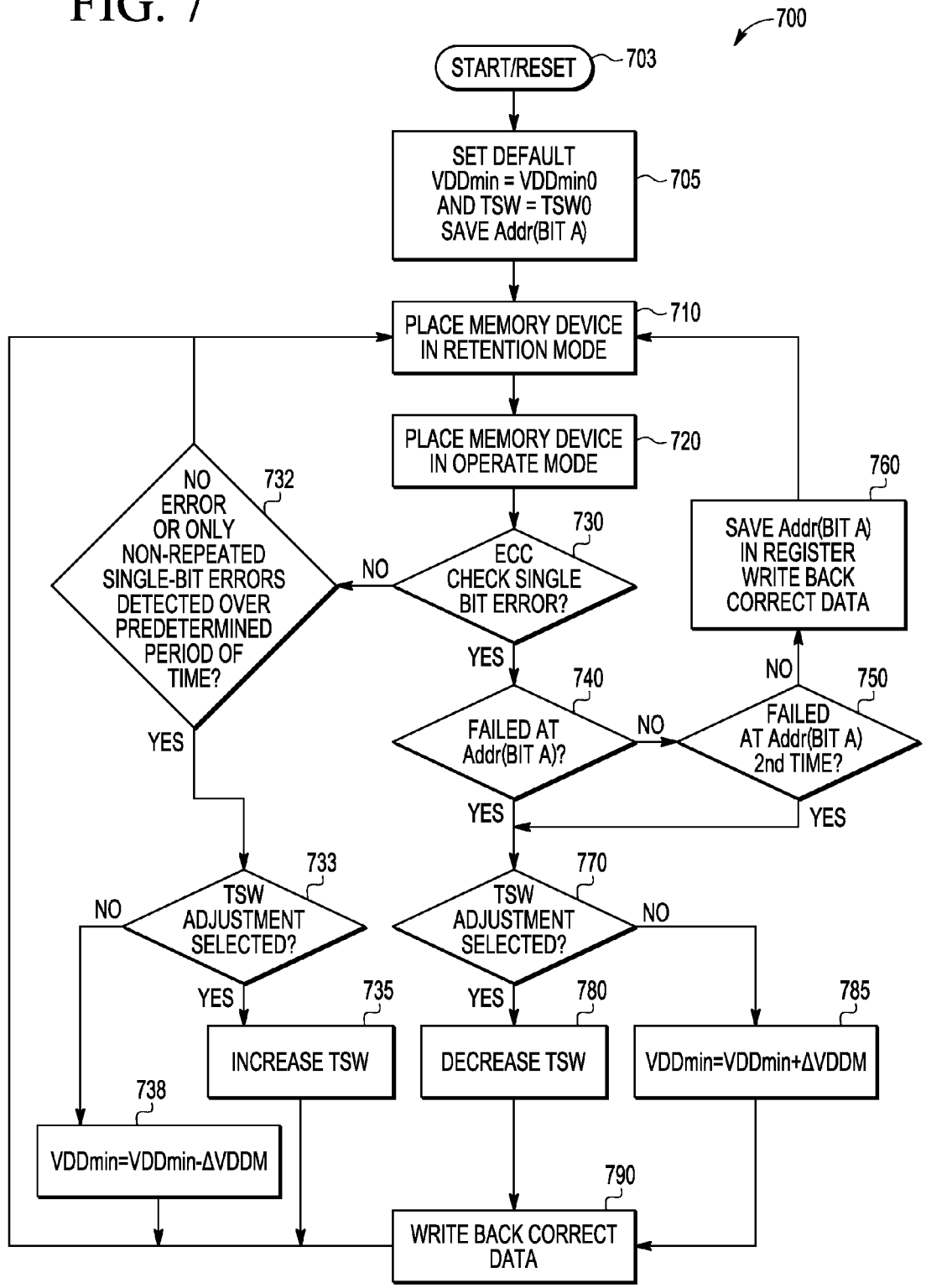
FIG. 7 is a flow chart illustrating a method for adjusting more than one retention parameter in accordance with an embodiment of the present invention.

FIG. 7 is a flow chart of a method 700 in accordance with an embodiment of the present invention. The method begins at 703 and proceeds to step 705 where parameter values, such as $V_{DDmin}$ and $T_{SW}$ are initialised, e.g., to default values. The location of the weakest bit, Bit A is stored. Other initialisation may also occur, such as setting a value of $\Delta V_{DDM}$.

At step 710 the device enters data retention mode (the second low-power mode). In some examples the device may enter the operation mode at step 720 directly from 705, without first entering the data retention mode at step 710.

At step 720 the device is brought to the operation mode, and a check is performed for bit errors at step 730. In the present example, it is assumed that single bit errors can be corrected, while errors in two or more bits can not necessarily be corrected. However, other error handling approaches are also possible.

If no errors are detected, at 732, it is determined whether a predetermined interval (e.g., a time period or number of cycles of retention mode and operation mode) has elapsed in which no errors or only non-repeated single-bit errors have been detected. In this case, a non-repeated single bit error is an error in Bit X, without the same Bit X experiencing a second error in the predetermined interval. Such errors are likely to be due to random events, such as radiation, with causes external to the device and unrelated to the operation of the device in retention mode. The period of time may be defined as a predetermined number of retention mode/operation mode, rather than a constant time period. In some examples, 732 may test for an absence of all errors in the memory device in the interval. In some examples more than one test may be applied, and different intervals may be used for each test. For example, at 732 it may be tested whether (P(1) AND P(2)) OR P(3) is true, where P(1)="no more than a single-bit error has occurred in Bit X during at least a first interval", P(2)=no errors have occurred in Bit A during at least a second interval, and P(3)=no errors have occurred in Bit A or Bit X in at least a third interval, where the end of each of the intervals is the current time. In some examples, the third interval may be shorter than the first and second intervals. In some examples, the intervals are measured differently (e.g., the first and second intervals may be measured in cycles between retention and operation modes, and the third interval may be measured as a time period).

If the predetermined interval has not elapsed no errors or only non-repeated single bit errors, the method returns to 710 when the device is next placed into the retention mode. However, if at 732 it is determined that no errors, or no repeated errors, have occurred during the predetermined interval, the method moves to 733. At 733 it is determined whether $T_{SW}$ is to be adjusted, for example by checking a user-defined parameter, referred to herein as Opt 2. When Opt 2 is in a first state, adjustment of $T_{SW}$ is enabled, while adjustment of $T_{SW}$ is disabled when Opt 2 is in a second state. If $T_{SW}$ is to be adjusted, the method moves to 735 and $T_{SW}$ is increased. In some examples $T_{SW}$ is increased by setting $T_{SW}=2*T_{SW0}$. In some examples TSW is set to double it's current value: $T_{SW}=T_{SW}\times 2$. In some embodiments, a predetermined value, $T_{SWMAX}$, may be set for $T_{SW}$, for example if $T_{SW}=T_{SW}\times 2$ is the normal increment of $T_{SW}$, $T_{SW}=\text{MIN}(T_{SWMAX}, T_{SW}\times 2)$. In some examples, adjustments to TSW are made by a frequency controller 820, as described in more detail below. If $T_{SW}$ is not to be adjusted, the method moves to 738, where $V_{DDmin}$ is reduced (e.g. by $\Delta V_{DDM}$) and $T_{SW}$ is reset to $T_{SW0}$. Thus, where an error attributable to the retention parameters has not occurred for a predetermined period of time (e.g. a predetermined number of retention cycles), the retention parameters can be adjusted to reduce the energy in the retention mode.

When no errors occur for a number of consecutive retention modes, it is possible that the retention parameters are too conservative, and that greater power saving could be achieved in the retention mode by using less conservative retention parameters. Where it is subsequently determined that the new retention parameters are not conservative, due to the presence of errors (e.g., in Bit A, or repeated errors in a Bit X) the retention parameters may be made changed again to reduce the risk of error, following a subsequent retention mode, as shown in FIG. 7.

If an error is detected at 730, it is determined whether Bit A failed. If Bit A failed, the method moves to 770, otherwise the method moves to 750. At 750, since a bit error has occurred, and the error was not in Bit A, Bit X (which is any bit other than Bit A) is determined to have failed. It is determined, at 750, whether or not the particular Bit X has been detected to fail previously. Where Bit X has failed previously, the method advances to 770. Where it is the first detected failure of Bit X, the method moves to 760, where the address of Bit X is stored (in order to facilitate future checks at 750) and the data is corrected (e.g. by error correction section 135). The method then returns to 710.

When a failure in Bit A has been detected at 740 or a second failure in Bit X is detected at 750 the method progresses to 770. At 770 it is determined whether $T_{SW}$ is to be adjusted, in a similar manner to that described above in relation to 733. When $T_{SW}$ is to be adjusted, the method advances to 780, where $T_{SW}$ is reduced (for example, in some examples $T_{SW}$ may be halved), and the method then moves to 790, where the data is corrected (e.g. by error correction section 135). If, at 770 it is determined that $T_{SW}$ is not to be adjusted, the method moves to 785, where $V_{DDmin}$ is increased by $V_{DDM}$ and $T_{SW}$ is reset to the initial value $T_{SW0}$. The method then moves to 790, where the date is corrected. After the retention parameter(s) have been updated (at 780 or 785) and the data corrected (at 790) the method returns to 710.

It should be noted that when returning to 710 from 760 or 790 the device need not return directly to the retention mode. The device may remain in the operation mode, and continue to check for and correct errors. However, detection of such errors will not cause the method to perform any of steps 740 to 790, since the retention parameter(s) has been updated, and the error was not the result of a retention mode with the current retention parameters. When the device next enters the retention mode, the method continues from 710 of FIG. 7.

Various rules for setting or resetting retention parameters would occur to the skilled person.

Figure 8:
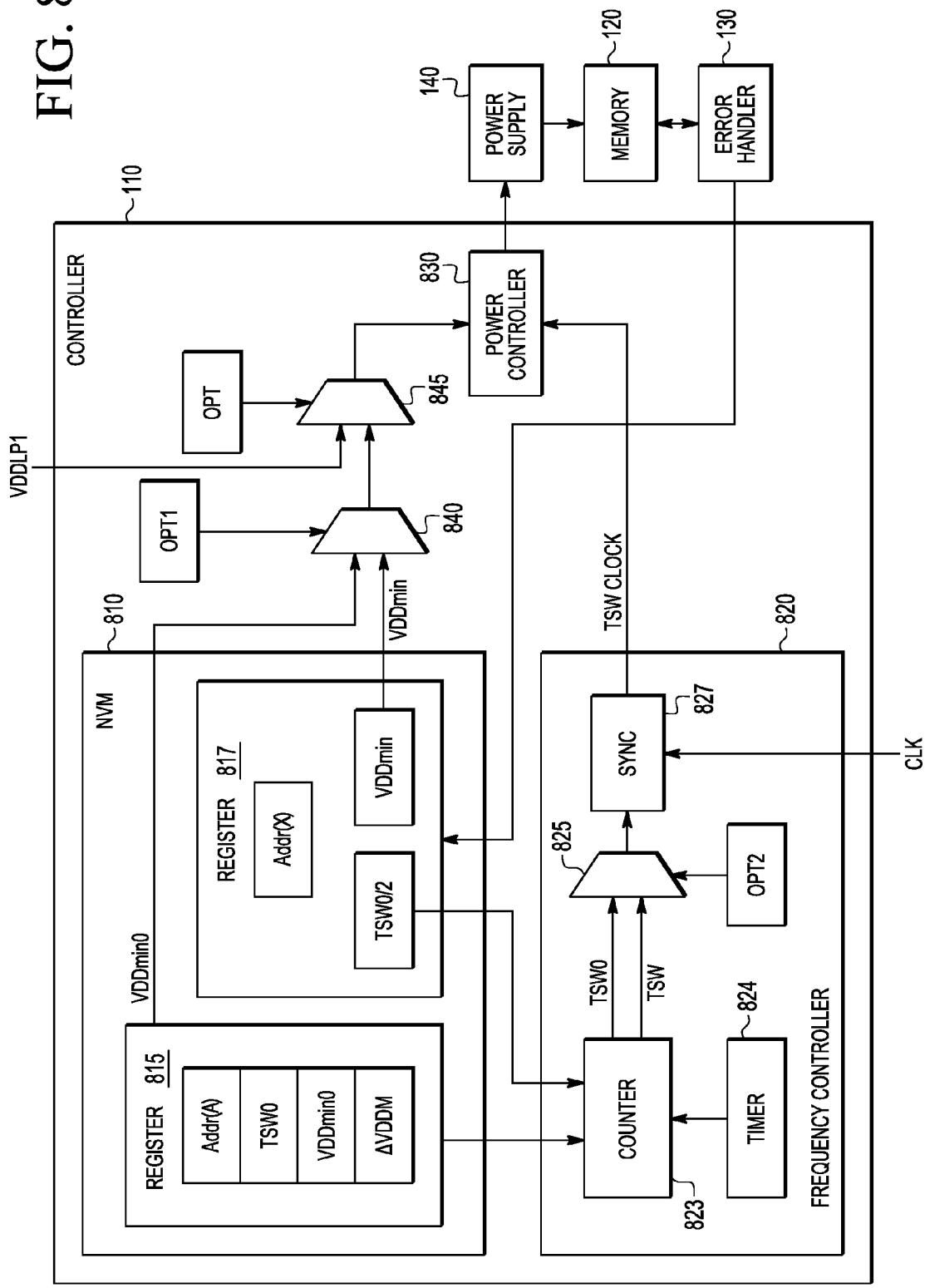
FIG. 8 is a schematic block diagram of a controller in accordance with an embodiment of the present invention.

FIG. 8 is a schematic block diagram of the controller 110 according to an embodiment of the present invention. The controller 110 includes a power controller 830 for controlling a voltage supplied to the memory device 120 by the power supply 140. The retention mode is enabled or disabled by an input Opt, provided to the power controller 830. In one embodiment, opt is user-selectable to enable or disable the retention mode. Herein, the user is not necessarily an end user, but may be a manufacturer of a device that includes the controller 110.

A non-volatile memory 810 stores the retention parameter(s) and other information used in the method that is to be retained after the memory 120 is powered down. For example, the NVM 810 may include an initial values register 815 to store initial values, such as default values of the retention parameter(s) (e.g., $T_{SW0}$ and $V_{DDmin0}$), a location of a weakest bit (e.g., Addr(A), the address of Bit A), and parameters used in adjusting the retention parameter (e.g., $\Delta V_{DDM}$). The NVM 810 may also include a register 817 to store current values of the retention parameter and other information for use in the retention method that is determined after initialisation of the device. For example, the register 817 may store a current value of $V_{DDmin}$, a current value of $T_{SW0}$, and/or the address (Addr(X)) of any bits (possibly excluding bit A) that have failed since the last change of retention parameter. As these are stored in non-volatile memory the current values of these parameters can be retained even when the device is powered down, such that the preferred retention parameters need not be determined again from scratch when the device is next powered on.

The actual parameter values need not be stored in some examples. For example, where the method of FIG. 7 is used, $T_{SW0/2}$ may simply represent a one-bit flag indicating whether the current value of $T_{SW}$ is $T_{SW0}$ or $T_{SW0}/2$.

The values in the register 817 may be set based on an output from the error handler 130. The value of $V_{DDmin}$ is provided to line selector 840. The line selector 840 receives $V_{DDmin0}$ from the initial value register 815, and $V_{DDmin}$ from the register 817, and provides one of these inputs to a second selector 845 based on the value of a user-selectable parameter Opt1. Opt1 defines whether or not $V_{DDmin}$ can be varied in the retention mode. When Opt 1 is set to allow $V_{DDmin}$ to vary, line selector 840 passes $V_{DDmin}$, and when Opt 1 is set not to allow $V_{DDmin}$ to vary, the line selector 840 passes $V_{DDmin0}$.

The second selector 845 receives either $V_{DDmin}$ or $V_{DDmin0}$ from the line selector 840, and also receives $V_{DDLP1}$. The second selector 845 then passes one of the received values to the power controller 830 based on the value of user-selectable parameter Opt. Opt determines whether the second power saving mode is disabled in the device. If Opt is set to disable the second low-power mode, the second selector 845 passes $V_{DDLP1}$ to the power controller 830, whereas if the second power saving mode is enabled, the second selector 845 passes the value received from the line selector 840 ($V_{DDmin}$ or $V_{DDmin0}$) to the power controller 830. Thus, when Opt 1 is set to prevent the second low-power mode, only $V_{DDLP1}$, the voltage for use in the first power saving mode, is passed to power controller 830. In this state, the device will transition directly between the first low-power mode and the operation mode, without transitioning to/from the second low-power mode.

A frequency controller 820 controls the period of time that $V_{DDLP2}$ is applied for in the second low-power mode. A counter 823 receives values of $T_{SW0}$ and $T_{SW0}/2$ from the registers 815 and 817. The counter 823 also receives a clock signal from a low power timer 824. The low power timer 824 may provide a 1 KHz clock, for example.

The counter 823 outputs signals indicative of the timings of $T_{SW0}$ and $T_{SW}$ to a third selector 825. The third selector 825 passes either $T_{SW0}$ or $T_{SW}$ to a synch section 827, based on user-selectable signal Opt2. Opt2 indicates whether or not $T_{SW}$ can be varied in the retention mode. The synch section 827 synchronises the signal from the third selector 825 with the system clock CLK and outputs a clock signal to the power controller 830.

In the example of FIG. 8, the controller 110 can control one or both of $V_{DDmin}$ and $T_{SW}$. $V_{DDmin}$ and $T_{SW}$ may be controlled according to the method of FIG. 7.

In some examples $T_{SW}$ may take values other than $T_{SW0}$ and $T_{SW0}/2$. In such examples the register 817 stores the current value of $T_{SW}$ and passes this to the counter 823.

As described above, according to some examples one or more retention parameters (e.g., $T_{SW}$ and/or $V_{DDmin0}$) are dynamically controlled by the cause and rate of ECC bit failure.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each logical signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logical blocks are merely illustrative and that alternative embodiments may merge logical blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the registers 815 and 817 of FIG. 8 could be implemented in a single register. Where a plurality of registers is used, the distribution of data between them is not particularly limited.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A controller for a memory device, comprising:
   a power control section to control power to a memory element of the memory device in an operation mode and in a retention mode;
   a monitoring section for receiving and monitoring error information indicative of an error in the memory device; and
   a storage section for storing a retention parameter, wherein,
      the power control section causes an operation voltage to be applied to the memory element in the operation mode, and causes a time-varying voltage to be applied to the memory element in the retention mode,
      the time-varying voltage changes between a first retention voltage and a second retention voltage, the second retention voltage being less than the first retention voltage, and the first retention voltage being less than the operation voltage,
      the power control section controls the second retention voltage based on the retention parameter, and
      the retention parameter is set based on the error information.

2. The controller of claim 1, wherein the error information is based on an error correction code.

3. The controller of claim 1, wherein the error information is determined based on a result of reading the memory in the operation mode.

4. The controller of claim 1, wherein the memory element is a reference memory element selected from a plurality of memory elements that form the memory device, the reference memory element selected based on a determination that the reference memory element is more susceptible to errors due to low voltage than other memory elements of the plurality of memory elements.

5. The controller of claim 1, wherein the memory element is selected from a plurality of memory elements based on a detection of an error in the memory element during the operation mode.

6. The controller of claim 5, wherein the retention parameter is set based on a number of detected errors in the memory element exceeding a predetermined threshold.

7. The controller of claim 1, wherein in the retention mode the power control section causes first and second applied voltages to be applied to the memory element, and wherein the retention parameter is used to determine at least one of,
   the value of the second applied voltage, and
   a timing for applying one or both of the first and second applied voltages in the retention mode,
   such that in the retention mode the voltage across the memory element varies between the first retention voltage and the second retention voltage.

8. The controller of claim 1, wherein the retention parameter is selected from a plurality of retention parameters based on a user-controlled setting.

9. The controller of claim 1, further comprising:
   a frequency controller, arranged to receive a user-controlled setting and the retention parameter, for controlling periods of time that a first applied voltage and a second applied voltage are supplied to the memory device,
   wherein the frequency controller includes,
      a selection section that selects, based on the user controlled setting, one of a clock based on a default value of the retention parameter and a clock based on an adjusted value of the retention parameter, and
      a synch section that synchronizes the clock selected by the selection section with a system clock.

10. A device, comprising:
    a memory device; and
    a controller coupled to the memory device, the controller comprising:
       a power control section to control power to a memory element of the memory device in an operation mode and in a retention mode;
       a monitoring section for receiving and monitoring error information indicative of an error in the memory device; and
       a storage section for storing a retention parameter, wherein,
          the power control section causes an operation voltage to be applied to the memory element in the operation mode, and a time-varying voltage to be applied to the memory element in the retention mode,
          the power control section causes the time-varying voltage to change between a first retention voltage and a second retention voltage, the second retention voltage being less than the first retention voltage, and the first retention voltage being less than the operation voltage,
          the power control section controls the second retention voltage based on the retention parameter, which is set based on the error information.

11. A method of controlling power to memory elements of a memory device, comprising:
    providing an operation voltage to the memory device in an operation mode;
    providing a time-varying voltage to the memory device in a retention mode;
    changing the time-varying voltage, based on a retention parameter, between a first retention voltage value and a second retention voltage value, the second retention voltage value being less than the first retention voltage value, and the first retention voltage being less than a value of the operation voltage;

receiving error information indicative of an error in a memory element of the memory device; and setting the retention parameter based on the error information.

12. The method of claim 11, wherein the error information is based on an error correction code.

13. The method of claim 11, wherein the error information is based on a result of reading the memory in the operation mode.

14. The method claim 11, wherein the memory element is a reference memory element selected from the memory elements based on a determination that the reference memory element is more susceptible to errors due to low voltage than other ones of the memory elements.

15. The method of claim 11, wherein the memory element is selected based on a detection of an error in the memory element during the operation mode.

16. The method of claim 15, wherein the retention parameter is set based on a number of detected errors in the memory element exceeding a predetermined threshold.

17. The method of claim 11, wherein the retention parameter is changed when the received error information indicates at least one of an occurrence of an error in a pre-selected reference memory element, and at least two occurrences of an error in a memory element other than the pre-selected reference memory element.

18. The method of claim 11, wherein in the retention mode the first and second retention voltages are applied to the memory element, and wherein the retention parameter determines at least one of the value of the second applied voltage, and a timing for applying one or both of the first and second retention voltages such that the voltage across the memory element varies between the first retention voltage and the second retention voltage.

19. The method of claim 11, wherein the retention parameter is selected from a plurality of retention parameters based on a user-controlled setting.

20. The method of claim 11, further comprising:

setting the retention parameter when the error information indicates that detected errors satisfy a predetermined condition, the predetermined condition being one of:

a) no errors in the memory device for a first interval;

b) only single-bit errors in a second interval;

c) no errors in a predetermined reference memory element; and d) a logical combination of two or more of a to c.

* * * * *